United States Patent
Nair et al.

(10) Patent No.: US 7,611,645 B2
(45) Date of Patent: *Nov. 3, 2009

(54) THICK FILM CONDUCTOR COMPOSITIONS AND THE USE THEREOF IN LTCC CIRCUITS AND DEVICES

(75) Inventors: Kumaran Manikantan Nair, Head of the Harbor, NY (US); Mark Frederick McCombs, Clayton, NC (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 11/398,337

(22) Filed: Apr. 5, 2006

(65) Prior Publication Data
US 2007/0235694 A1    Oct. 11, 2007

Related U.S. Application Data

(60) Provisional application No. 60/674,433, filed on Apr. 25, 2005.

(51) Int. Cl.
*H01B 1/00* (2006.01)

(52) U.S. Cl. .......... 252/514; 252/519.51; 264/104; 361/321.1; 361/523; 501/15; 501/16; 501/32

(58) Field of Classification Search .......... 252/512, 252/518, 514, 521, 500; 361/321.1, 523; 438/686; 428/426; 501/15, 16, 32; 264/104
See application file for complete search history.

(56) References Cited

U.S. PATENT DOCUMENTS

| | | | |
|---|---|---|---|
| 4,381,945 A | 5/1983 | Nair | |
| 4,654,095 A | 3/1987 | Steinberg | |
| 4,880,567 A * | 11/1989 | Prabhu et al. | 252/512 |
| 4,906,404 A * | 3/1990 | Suehiro et al. | 252/512 |
| 5,175,130 A | 12/1992 | Kondo et al. | |
| 5,254,191 A | 10/1993 | Mikeska et al. | |
| 5,298,330 A | 3/1994 | Stadnicar, Jr. et al. | |
| 5,378,408 A | 1/1995 | Carroll et al. | |
| 5,518,663 A | 5/1996 | Labranche et al. | |
| 5,645,765 A * | 7/1997 | Asada et al. | 252/519.51 |
| 5,744,232 A | 4/1998 | Bailey et al. | |
| 5,948,536 A * | 9/1999 | Suzuki et al. | 428/426 |
| 6,124,224 A * | 9/2000 | Sridharan et al. | 501/15 |

(Continued)

FOREIGN PATENT DOCUMENTS

EP    0132810 A1 *    7/1984

(Continued)

*Primary Examiner*—Mark Kopec
*Assistant Examiner*—Khanh Tuan Nguyen

(57) ABSTRACT

The present invention is directed to a thick film composition for use in low temperature co-fired ceramic circuits comprising, based on weight percent total thick film composition: (a) 30-98 weight percent finely divided particles selected from noble metals, alloys of noble metals and mixtures thereof; (b) one or more selected inorganic binders and/or mixtures thereof, and dispersed in (c) organic medium, and wherein said glass compositions are immiscible or partially miscible with remnant glasses present in the low temperature co-fired ceramic substrate glasses at the firing conditions.

Figure 1:
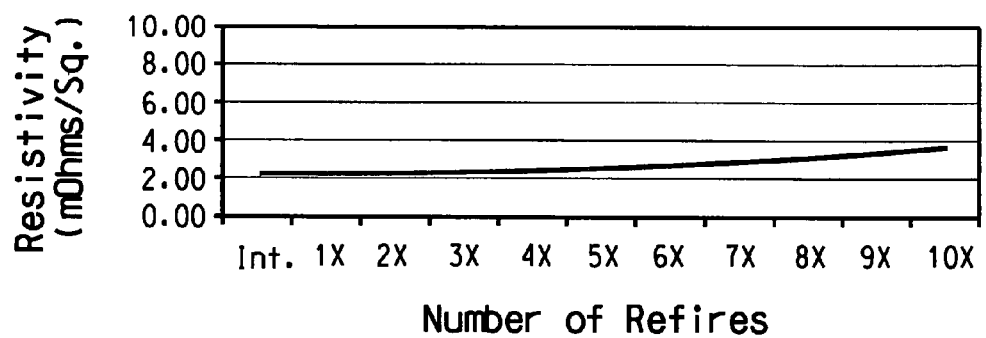

The present invention is further directed to methods of forming multilayer circuits utilizing the above composition and the use of the composition in high frequency applications (including microwave applications).

7 Claims, 2 Drawing Sheets

U.S. PATENT DOCUMENTS

| | | | |
|---|---|---|---|
| 6,147,019 A | 11/2000 | Donohue | |
| 6,982,864 B1 * | 1/2006 | Sridharan et al. | 361/321.1 |
| 7,176,152 B2 * | 2/2007 | Brown et al. | 501/16 |
| 7,189,343 B2 * | 3/2007 | Mears | 252/512 |
| 2003/0207745 A1 * | 11/2003 | Masuko | 501/32 |
| 2004/0245508 A1 * | 12/2004 | Wang et al. | 252/500 |
| 2005/0104046 A1 * | 5/2005 | Wang et al. | 252/500 |
| 2006/0009036 A1 * | 1/2006 | Bacher et al. | 438/686 |
| 2006/0028788 A1 * | 2/2006 | Sridharan et al. | 361/523 |
| 2006/0163768 A1 * | 7/2006 | Needes et al. | 264/104 |

FOREIGN PATENT DOCUMENTS

| | | |
|---|---|---|
| EP | 0 451 771 A | 10/1991 |
| EP | 1 534 053 A | 5/2005 |
| GB | 772675 | 4/1957 |

* cited by examiner

THICK FILM CONDUCTOR COMPOSITIONS AND THE USE THEREOF IN LTCC CIRCUITS AND DEVICES

FIELD OF THE INVENTION

The invention relates to thick film conductor compositions, including via-fill conductor compositions, which are useful in the manufacture of Low Temperature Co-fireable Ceramic (LTCC) multilayer ceramic circuits and devices, as well as the LTCC circuits and devices themselves. The invention further relates to the use of the thick film compositions, circuits and devices in microwave and other high frequency applications.

TECHNICAL BACKGROUND OF THE INVENTION

An interconnect circuit board of an LTCC design is a physical realization of electronic circuits or subsystems made from a number of extremely small circuit elements that are electrically and mechanically interconnected. It is frequently desirable to combine these diverse electronic components in an arrangement so that they can be physically isolated and mounted adjacent to one another in a single compact package and electrically connected to each other and/or to common connections extending from the package.

Complex electronic circuits generally require that the circuit be constructed of several layers of conductors separated by insulating dielectric layers. The conductive layers are interconnected between levels by electrically conductive pathways, called vias, through a dielectric layer. The conductors useful in LTCC technology are typically thick film conductors. LTCC multilayer structures allow a circuit to be more compact than traditional $Al_2O_3$ substrates by allowing vertical integration.

Similar to other thick film materials, thick film conductors are comprised of an active (conductive) metal and inorganic binders, both of which are in finely divided form and are dispersed in an organic vehicle. The conductive phase is ordinarily gold, palladium, silver, platinum or alloy thereof, the choice of which depends upon the particular performance characteristics which are sought, e.g., resistivity, solderability, solder leach resistance, bondability, adhesion, migration resistance and the like. In multilayer LTCC devices, additional performance characteristics are sought for internal conductor lines and via conductors which include minimization of conductor line "sinking" into the top and bottom dielectric layers on firing, minimal resistivity variation on repeated firing, optimal interface connectivity of line conductor to that of via-fill conductor, and optimal interface bonding of via-fill conductor to that of surrounding ceramic materials.

LTCC thick film compositions and tapes have been used in prior art high frequency applications, such as telecommunications, automotive or military applications including radar, for its multilayer, cofiring and flexible design capabilities. Many properties are required of the conductors used in the fabrication of multilayer circuits for high frequency including microwave applications, including desired resistivity, solderability, solder leach resistance, wire bondability, adhesion, migration resistance, and long term stability.

In addition to the proper level of conductivity and other properties listed above, there are many secondary properties which must also be present such as, wire bondability, good adhesion to both ceramic and thick films, solderability and compatibility to other thick films, both surface and buried, long-term stability without little or less properties degradation.

As would be expected, a most critical variable in the technology of thick film conductors for use in LTCC devices is the resistivity variation by interaction with surrounding ceramics. Of particular importance in this regard has been the incorporation of high-melting refractory glasses and glasses have little or no miscibility with the remnant glasses present in the surrounding ceramics. Furthermore, additional incorporation of metal oxide and non-metal oxide binder materials in the composition increases the densification of the conductor composites and/or control the growth of crystalline materials into the conductor composites which would change the resistivity of the composites, a non-desirable result.

U.S. Pat. No. 5,744,232 to Bailey discloses a thick film metallization compatible with LTCC that display very low microwave insertion losses commensurate with those of thin film gold. The electrical performance of the metallization is attained by using a spherical metal particle shape and uniform particle size distribution in the thick film paste.

Another issue of concern with prior art via-fill compositions involves the entrapment of water in the via composition which upon processing (firing) leads to an increase in the vapor pressure of the water and "explosion" of the LTCC structure.

The present invention overcomes problems associated with prior art thick film conductor compositions for use in LTCC and microwave applications. In particular, the present invention provides thick film compositions and LTCC structures, which provide superior refire stability.

DETAILED DESCRIPTION OF THE FIGURES

FIG. 1 details the resistivity performance of a silver conductor system upon initial firing and refiring conditions using a daisy chain test.

Figure 2:
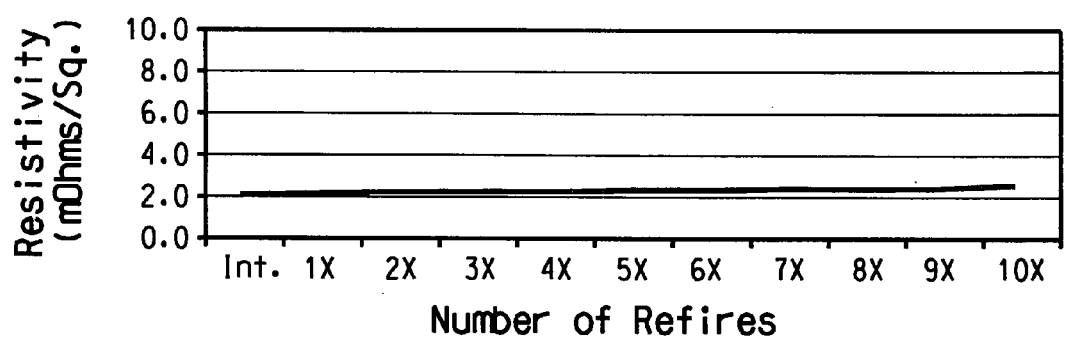

FIG. 2 details the resistivity performance of a gold conductor system upon initial firing and refiring conditions using a buried serpentine test.

Figure 3:
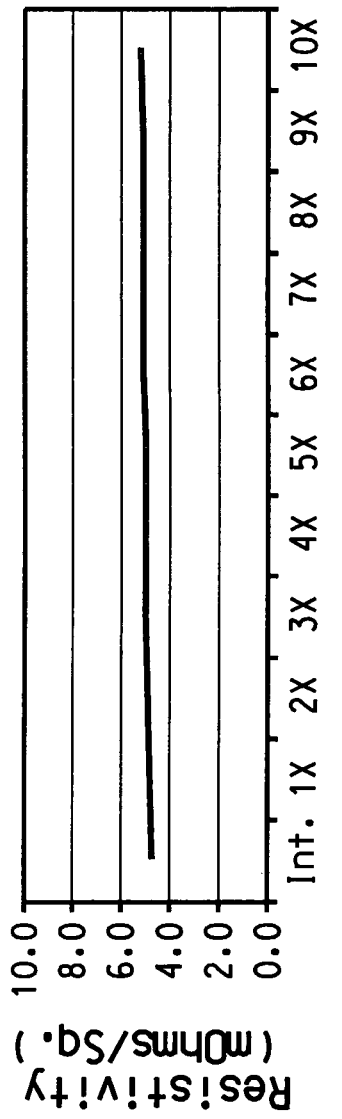

FIG. 3 details the resistivity performance of a gold conductor system upon initial firing and refiring conditions using a daisy chain test.

Figure 4:
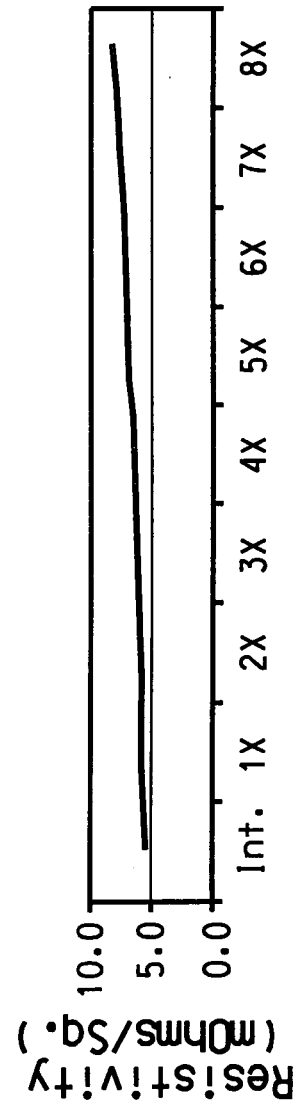

FIG. 4 details the resistivity performance of a mixed metal conductor system upon initial firing and refiring conditions using a daisy chain test.

SUMMARY OF THE INVENTION

The present invention is directed to a thick film composition for use in low temperature co-fired ceramic circuits comprising, based on weight percent total thick film composition:
  (a) 30-98 weight percent finely divided particles selected from noble metals, alloys of noble metals and mixtures thereof;
  (b) one or more inorganic binders selected from
    (1) 0.2-20 weight percent of one or more refractory glass compositions with a specific viscosity (log n) in the range of 6-7.6 at the firing temperature of said circuit,
    (2) 0.1-5 weight percent of an additional inorganic binder selected from (i) metal oxides, (ii) precursors of metal oxides; (iii) non-oxide borides; (iv) non-oxide silicides; and (v) mixtures thereof; and
    (3) mixtures thereof; dispersed in
  (c) organic medium; and wherein said glass compositions are immiscible or partially miscible with remnant glasses present in the low temperature co-fired ceramic substrate glasses at the firing conditions.

The present invention is further directed to methods of forming multilayer circuits utilizing the above composition and the use of the composition in high frequency applications (including microwave applications).

DETAILED DESCRIPTION OF THE INVENTION

The invention is directed to a novel noble metallization for use in the manufacture of printed conductors for LTCC ceramics which have outstanding electrical properties on repeated firing of the devices, and other desired conductor properties in the application of both conventional and "green" electronic components and complex electronic devices.

In particular, the invention is directed to a series of metal metallizations suitable for the manufacture of pure silver, gold and mixed metal electronic devices, which is admixture of: (a) 30-98% by weight finely divided conductive particles selected from noble metal, alloys of noble metals, and mixtures thereof, (b) 0.2-20% by weight finely divided particles selected from the group consisting of one or more refractory glasses wherein said refractory glasses have little/no miscibility to the remnant glasses present after the crystallization of the LTCC tape glasses, (d) 0.1-5% by weight inorganic metal oxides and/or inorganic compounds/or organometallics capable of controlling the densification, sintering and grain growth of the conductor composites.

The above indicated functionality of the components being obtainable by firing the mixture to effect sintering of the inorganic materials, glasses and metal or collectively the firing of the LTCC composite systems.

In a further aspect, the invention is directed to screen-printable and/or stencil-applicable paste comprising the above-described metallization dispersed in organic medium. Still further, the invention is directed to conductive elements comprising a nonconductive LTCC ceramic substrate having a conductive pattern and connecting or non connecting via-fill conductive pattern affixed thereon, formed by printing a pattern of above-described screen-printable and/or stencil-applying paste and firing the printed and/or laminated LTCCs to effect volatization of the organic medium and liquid phase sintering of the inorganic materials and metallization. In yet another aspect, the invention is directed to a process for making conductors alone and/or in conjunction with via-fills comprising (a) applying patterned thick film of the above-described screen-printable paste to a non conductive ceramic substrate, (b) drying the film at a temperature below 200° C. and (c) firing the dried film to effect liquid phase sintering of the inorganic materials and metallization.

In one embodiment, the main components of the thick film conductor composition(s) of the present invention are electrically conductive noble metal powders, alloys of noble metal powders and mixtures thereof; one or more inorganic binders selected from (a) refractory glass compositions with a specific viscosity (log n) in the range of 6-7.6 at the firing temperature of the LTCC circuit, (b) 0.1-5 weight percent of an additional inorganic binder selected from (1) metal oxides of Zn, Mg, Co, Al, Zr, Mn, Ni, Cu, Ta, W. La and other "glass network-modifying" refractory metal oxides (2) precursors of the metal oxides of (1); (3) non-oxide borides; (4) non-oxide suicides; and (5) mixtures thereof, and (c) mixtures thereof; dispersed in organic medium. The components are discussed herein below.

A. Conductive Material

The finely divided metals used in the invention can be of those selected from noble metal, alloys of noble metals, and mixtures thereof, many of which are commercially available.

The particle size of the above-described metallic materials is not narrowly critical from the standpoint of their technical effectiveness in the invention. However, they should, of course, be of a size appropriate to the manner in which they are applied, which is usually screen-printing and/or stencil-applying, and to the firing conditions. Furthermore, particle size and morphology of the above-mentioned metal powders should be appropriate in screen-printing and/or stencil-applying over non-fired ceramic tape of thickness between 2 mil to 10 mil and to the laminating conditions of the composite and to the firing conditions.

Thus the metallic material should be no bigger than 10 um and preferably should be below about 5 um. As a practical matter, the available particle size of the metals is as low as 0.1-10 um for palladium, from 0.1 to 10 um for silver, 0.2-10 um for platinum and from 0.5-10 um for gold.

When Pd/Ag is used as the conductive material, the ratio of Pd/Ag metal powders can vary between 0.06 and 1.5 preferably between 0.06 and 0.5. When Pt/Ag is used as the conductive material, the ratio of Pt/Ag metal powders can vary between 0.003 to 0.2 and preferably 0.003 to 0.05. Similar ratios can be used in the case of Pt/Pd/Au. The metal powders can have either flake or non-flake morphology. The non-flake powders can be irregularly shaped or spherical. By flake morphology is meant a metal powder whose predominant shape is flake as determined by scanning electron microscopy. Such flake silvers have an average surface area of approximately 1 m2/g and solid contents of approximately 99-100% by weight. Non-flake silver powders typically have an average surface area to weight ratio of 0.1-2.0 m2/g and solid contents of approximately 99-100% by weight. Palladium metal powder has an average surface area to weight ratio of 2.0-15.0 m2/g, preferably, 7.0-11.0 m2/g and solid contents of approximately 99-100% by weight. Platinum metal powder has a surface area to weight ratio of approximately 10 m2/g to 30 m2/g and a solids content of 98-100% by weight. Examples of gold powders used in embodiments of the present invention include gold metal powders which typically have a particle size distribution (PSD) d50~0.5 to 5 um, measured using Scanning Electron Microscope (SEM) and a solids content of 99-100% by weight. In some embodiments the gold metal powders are mono-sized, comprise few twins, and have a tight PSD. Coarser powders of d50~5 um with wider distribution also used.

In one embodiment of the present invention spherical metallic powders are utilized. These spherical metallic powders, when packed have a greater particle-to-particle contact versus flake and other shaped powders, which gives rise to a metal-to-metal contact and thus a relatively continuous flow of electrons for conduction when combined with the other components of the present invention. These closely packed metal spherical particles allow for "tetrahedral" and/or "octrahedral" voids, wherein the specific inorganic binders of the present invention, such as metal oxides and/or glasses described below, may settle and upon processing the inorganic binders soften and hold the structure together in a uniform honeycomb-type structure with superior metal-to-metal contact and more continuous electron flow as compared to prior art compositions. In one embodiment, spherical metallic particles with an average particle size distribution in the range of 1 to 4 microns are preferred. In another embodiment, an average particle size of 2 to 3 microns is preferred. These spherical powders when in combination with the inorganic binders described below are particularly useful in microwave applications.

B. Inorganic Glass Binder

The inorganic binders of the present invention are one or more inorganic binders selected from (1) 0.2-20 weight percent of one or more refractory glass compositions with a specific viscosity (log n) in the range of 6-7.6 at the firing temperature of said circuit, (2) 0.1-5 weight percent of an additional inorganic binder selected from (i) metal oxides, (ii) precursors of metal oxides; (iii) non-oxide borides; (iv) non-oxide silicides; and (v) mixtures thereof, and (3) mixtures thereof.

The glass component of the conductor compositions of this invention is a, high-softening point, high viscosity glass at 0.2-20 parts by weight level and, preferably, at 1-15 parts level.

As used herein, the term high-softening point glass is one having a softening point 600-950° C., preferably, 750-870° C. as measured by the parallel plate viscosity measuring techniques (ASTM method).

The glass utilized in this invention must also be immiscible or have only partial miscibility with the remnant glasses present in the LTCC substrate glasses at the firing conditions. Upon firing of an LTCC structure glasses present in the LTCC dielectric "green" tape will partially crystallize and result in the formation of very low melting "remnant glasses" along with the high melting inorganic crystalline materials. The chemistry of the "remant" glass will be different than that of the "parent" glass; as a result, the softening point and other properties of "remant" glass will also be different from its "parent" glass. As a general rule, the viscosity of the "remant" glass at the LTCC firing temperature will be lower than the "parent" glass.

In prior art systems, cofired conductors can react with these low melting "remnant glasses" resulting in undesirable results such as: (1) increased resistance of the conductors; (2) conductor lines which "sink" within the dielectric tape on refire; and (3) conductors which completely disperse within the dielectric upon multiple refires. In regard to via fill conductors, these remnant glasses can migrate into the via fill conductor compositions of the prior art and crystallize or leave remnant glasses at the via cavity which results in a very high conductor resistance.

In the present invention, a glass having a specific viscosity (log n) of ~6 to ~7.6 at the firing temperature which is capable of reduced intermixing with glasses present in the LTCC substrate glasses, but at the same time capable of aiding the sintering processes of the metallization is preferred.

Typical examples of glasses meeting the above criteria are of the "alumino-boro-silicate glass network" type and may contain "glass network modifying" ions, selected from ions of Ca, Ba, Ti, Fe, Mg, Na, K, and mixtures thereof. Representative glasses include the following composition comprising, as described based on weight percent total glass composition, 40-60% $SiO_2$, 10-20% $Al_2O_3$, 10-15% $B_2O_3$, 15-25% CaO, 1-5% selected from the other above-mentioned "network modifying" ions. A particularly preferred glass comprises, based on weight percent total glass composition, 55% $SiO_2$, 14% $Al_2O_3$, 7.5% $B_2O_3$, 21.5% CaO, and the balance 2% the above-mentioned "networking modifying" ions. Another preferred glass comprises, based on weight percent total glass composition, 56.5% $SiO_2$, 9.1% $Al_2O_3$, 4.5% $B_2O_3$, 15.2% BaO, 10.0% CaO and the balance 5% selected from the other above-mentioned "network modifying" ions.

The glasses are prepared by conventional glass-making techniques, by mixing the desired components in the desired proportions and heating the mixture to form a melt. As is well-known in the art, heating is conducted to a peak temperature and for a time such that the melt becomes entirely liquid and homogenous. In the present work the components are premixed in a polyethylene jar with plastic balls and melted in a platinum crucible at 1350-1400° C. The melt is heated at the peak temperature for 1-1.5 hours. The melt is then poured into cold water. The maximum temperature of the water during quenching is kept as low as possible by increasing the volume of water to melt ratio. The crude frit, after separation from water, is freed from residual water by drying in air or displacement of water by rinsing with methanol, or other suitable method. The crude frit is the ball-milled for 6-7 hours in alumina containers using alumina balls. Alumina picked up by the materials, if any, is not within the observable limits as measured by X-ray diffraction analysis.

After discharging the milled slurry from the mill, the excess solvent is removed by decantation and the frit powder is hot air-dried. The dried powder is then screened through a 325 mesh screen to remove any large particles.

The major two properties of the frits are: it aids the sintering of the inorganic crystalline particulate matters and minimizes the intermixing of conductor materials with remnant glasses present in the LTCC ceramics.

C. Metal Oxide/Non-Oxide Binder

The metal oxides and non-oxides, such as borides and suicides, which are suitable for the practice of the invention are those which are capable of reacting with remnant glasses of the tape and increase the viscosity of the remnant glasses when the composition of the invention is cofired with the tape, either on the surface or buried. Additionally the binders useful in the present invention should act as "sintering inhibitors" for the metal powders during firing of the system. Thus, minimizing the densification of the line conductors and via-fill conductors.

Suitable inorganic oxides are those based on $Zn^{2+}$, $Mg^{2+}$, $Co^{2+}$, $Al^{3+}Zr^{4+}$, $Mn^{2+}$, $Ni^{2+}$, $Cu^{2+}$, $Ta^{3+}$, $W^{4+}$, $La^{3+}$ and other "glass network modifying" refractory oxides and complex oxides such as copper bismuth ruthenate, and organometallic compounds such as organotitanate those disclosed in U.K. Pat. No. 772,675 and U.S. Pat. No. 4,381,945, incorporated herein, that will decompose into finely divided powders of metal oxides during the firing of the system.

The particle size of the metal oxides or precursors should be the size appropriate to the manner in which the composition of the invention is applied, which usually by screen printing, thus the particle size should be no larger than 15 um and preferably should be below 5 um.

D. Organic Medium

The inorganic components are typically dispersed into an organic medium by mechanical mixing to form viscous compositions called "pastes" having suitable consistency and rheology for printing. A wide variety of inert liquids can be used as organic medium. The rheological properties of the medium must be such that they lend good application properties to the composition, including: stable dispersion of solids, appropriate viscosity and thixotropy for screen printing, acceptable unfired "green" strength, appropriate wettability of the substrate and the paste solids, a good drying rate, and good firing and burn out properties. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The inorganic particles are mixed with an inert liquid medium (vehicle or medium) typically by mechanical mixing (e.g. on a roll mill) to form a paste-like composition having suitable consistency and rheology for screen printing and/or stencil applying. The latter is printed as a "thick film" on LTCC green tapes in the conventional manner. Any inert liquid may be used as the vehicle. Various organic liquids, with or without the thickening and/or stabilizing agents and/or other common additives may be used as the vehicle. The only specific criteria of the vehicle is that it must be chemically compatible to the organics present in the LTCC green tapes. Exemplary of organic liquids which can be used are the aliphatic alcohols, esters of such alcohols, for example, acetates and propionates, terpenes such as pine oil, terpinol and the like, texanol and the like, solutions of resins such as ethyl cellulose in solvents as pine oil, and the monobutyl ether of ethylene glycol monoacetate.

The vehicle may contain volatile liquids to promote fast setting after application to the tape.

The ratio of vehicle to solids in the dispersions can vary considerably and depends upon the manner in which the dispersion is to be applied and the kind of vehicle used and furthermore the use of the conductors are for the conductor lines and/or via-fill conductor connections. Normally to achieve good coverage the dispersions will comprise 60-98% solids and 40-2% organic medium (vehicle). The compositions of the present invention may, of course, be modified by the addition of other materials, which do not affect its beneficial characteristics. Such formulations are well within the skill of the art.

Applications

The conductor composition(s) of the present invention may be used in conjunction with uncured ceramic material, such as Green Tape™ Low Temperature Cofired Ceramic (LTCC), and various other paste components, to form a multilayer electronic circuit. Green Tape™ is typically used as a dielectric or insulating material for multilayer electronic circuits. A sheet of Green Tape™ is blanked with registration holes in each corner to a size somewhat larger than the actual dimensions of the circuit. To electrically connect various layers of the multilayer circuit, via holes are formed in the Green Tape™. This is typically done by mechanical punching, however, any suitable method may be utilized. For example, a sharply focused laser can be used to volatilize and form via holes in the Green Tape™.

Filling the vias with a thick film conductive composition (via-fill composition) forms the interconnections between layers. In the case of this invention, the thick film conductive composition disclosed herein may be utilized as a via-fill composition. This conductive via-fill composition is usually applied by standard screen printing techniques, however, any suitable application technique may be employed. Each layer of circuitry is typically completed by screen printing conductor tracks. These tracks can utilize compositions of the present invention, or other suitable conductor compositions, or a combination thereof. Also, resistor inks or high dielectric constant inks can be printed on selected layer(s) to form resistive or capacitive circuit elements. Conductors, resistors, capacitors and any other components are typically formed by conventional screen printing techniques and are deemed as functional layers.

The conductor composition(s) of the present invention may be printed on the outermost layers of the circuit, either before or after lamination. Additionally, the conductor composition(s) of the present invention may be used on one or more of the inner layers of the circuit, as well. Furthermore, embodiments of the conductor composition(s) of the present invention may be used as a via-fill composition, as well. It is understood by those skilled in the art that the circuit may comprise "blank layers" or layers of dielectric or insulating material on which no functional conductive, resistive, or capacitive layers are deposited.

The outermost layers of the circuit are used to attach components. Components are typically wire-bonded, glued or soldered to the surface of fired parts.

After each layer of the circuit is completed, the individual layers are collated and laminated. A confined uniaxial or isostatic pressing die is typically used to ensure precise alignment between layers. The assemblies are trimmed to an appropriate size after lamination or after firing. Firing is typically carried out in a conveyor belt furnace or in a box furnace with a programmed heating cycle. The tape may be either constrained or free sintered during the firing process. For example, the methods disclosed in U.S. Pat. No. 4,654,095 to Steinberg and U.S. Pat. No. 5,254,191 to Mikeska may be utilized, as well as others known to those skilled in the art.

As used herein, the term "firing" means heating the assembly in an oxidizing atmosphere, such as air to a temperature, and for a time sufficient to volatilize (burn-out) the organic material in the layers of the assemblage and allow reaction and sintering of the inorganic components of both the tape and conductors. "Firing" causes the inorganic components in the layers, to react or sinter, and thus densify the entire assembly, thus forming a fired article. This fired article may be a multilayered circuit used in telecommunications, military or automotive applications (such as automotive position sensors, radar, transmit receive modules, antennas etc).

The term "functional layer" refers to the printed Green Tape™, which has conductive, resistive, capacitive or dielectric functionality. Thus, as indicated above, a typical Green Tape™ layer may have contain one or more conductive traces, conductive vias, resistors and/or capacitors.

As noted above, some embodiments of the composition(s), multilayer circuit(s) and device(s) of the present invention are particularly useful in microwave applications. "Microwave applications" are defined herein as applications which require a frequency in the range of 300 MHz to 300 GHz ($3\times10^8$ to $3\times10^{11}$ Hz). Furthermore, the present invention is useful in high frequency applications such as transmit/receive modules and radar applications. Still further, some of the embodiments of the present invention are useful in the formation of microwave circuit components including, but not limited to: antenna, filters, baluns, beam former, I/O's, couplers, feedthroughs (via or EM coupled), wirebond connection, and transmission lines.

Formulation of Thick Film Compositions (Pastes)

The thick film compositions of the present invention were prepared according to the following general methodology. The inorganic solids are mixed with the organic medium and dispersed with suitable equipment, such as a three-roll mill, to form a suspension, resulting in a composition for which the viscosity will be in the range of 100-200 Pascal-seconds at a shear rate of 4 sec-1 for the line conductor compositions and the corresponding value for via-fill conductors is 1000-5000 Pascal-seconds.

In the examples, which follow, the formulation was carried out in the following manner: The ingredients of the paste, minus about 2-5% of the organic components, were weighed together in a container. The components were then vigorously mixed to form a uniform blend; then the blend was passed through dispersing equipment, such as a three roll mill, to achieve a good dispersion of particles. A Hegman gauge was used to determine the state of dispersion of the particles in the paste. This instrument consists of a channel in a block of steel that is 25 um deep (1 mil) on one end and rams up to 0" (i.e., 0-25 um range) depth at the other end. A blade was used to draw down paste along the length of the channel. Scratches appeared in the channel where agglomerates' diameter was greater than the channel depth. A satisfactory dispersion gave a fourth scratch point of 10-18 um, typically. Fourth scratch measurements of >20 um and half channel measurements of >10 um indicated a poorly dispersed suspension/paste.

Next, the remaining 2-5% of the organic components of the paste was added, and the resin content was adjusted to bring the viscosity of the composition to the desired value.

The composition was then applied to a substrate, such as alumina or simliar refractory ceramics, in this particular case, to the "green tape". The "green tape" was formed by casting a 1-20 mil, preferably 2-10 mil, thin layer of a slurry dispersion of the glass and ceramic filler fine particulates, polymeric binder(s) and solvent(s) as described in the art of "tape casting" into a flexible substrate, and heating the cast layer to remove the volatile solvent. The tape is blanked into sheets or provided in roll form. This green tape is used as an insulating substrate for multilayer electronic circuits/devices, in place of conventional substrates, such as alumina and other refractory ceramic substrates. The green tape sheet is blanked with registration holes at the four corners, and via holes to connect the different layers of conductors using mechanical punching. The size of via holes varies depending on circuit design and property requirements. The interconnections of circuit between conductor track layers of the tape are typically applied by screen printing the conductive inks in the via holes.

The conductive line compositions of the present invention were applied to a sheet of green tape, by the process of screen printing, to a wet thickness of about 10-30 um and the via holes were filled with respective conductive via compositions.

After each layer of tape is printed with conductor lines and via holes as appropriate to the circuit design, the individual layers are collated, laminated and pressed using uniaxial or isostatic pressing die and techniques as described elsewhere in the art of tape pressing/lamination techniques. It will be recognized by those skilled in the art that in each of the laminating steps the printed tape layers must be accurate in registration so that the vias are properly connected to the appropriate conductive lines of the adjacent functional layer, and in the case of thermal vias, each via will be connected appropriately to the next one.

Firing to effect sintering of the green tape compositions and of the inorganic binder as well as the finely divided particles of metal, is preferably done in a well ventilated belt conveyor furnace or programmed box furnace with a temperature profile that will allow de-polymerization of polymers; and/or burnout of the organic matter at about 300-600° C., a period of maximum temperature of about 800-950° C., lasting about 5-20 minutes, followed by a controlled cool down cycle to prevent over-sintering and crystal growth, unwanted chemical reactions at intermediate temperatures, or substrate/fired ceramic tape fracture from too rapid cool down. The overall firing procedure will preferably extend over a period of between 3.5 to 5 hours, and in certain cases it could take up to 24 hours or more depending on the number of layers of green tapes laminated together and/or the thickness of the green tape layers.

The fired thickness of the conductor can range from about 5 to about 15 um, depending on the percent of solids, the type of screen the composition is printed with, the printer set up, and degree of sintering of the inorganic solids. The thickness of via conductors vary depending on the thickness of the green tape used and degree of sintering of the via composition. In order to avoid two major defects, dimpling and posting of the vias, the selection of viscosity and solid content of the composition is important. In general, increased solid content could result in posting and lower solid content will result in dimpling.

The conductor compositions of this invention can be printed as film onto the green tapes or ceramic substrates, or onto other thick films either by using an automated printer or a hand printer in the conventional manner. Preferably, automation screen printing techniques are employed, using 200 to 325 mesh screen with 0.5 um emulsion thickness. Conventional stencil printing techniques are also can be used, particularly for filling the smaller vias of size 4-8 um.

Test Procedures

In the examples below, the resistance variation was measured in the following manner: Samples to be tested for resistance variation after repeated firing were prepared as follows.

A "daisy chain" pattern shown in FIGS. (1, 3 and 4) of the conductor formulation to be tested was screen printed upon green sheets of tapes, laminated, and fired in a belt furnace using a "tape heating and cooling profile" as described earlier. The "daisy chain" pattern consisted of over 5000 squares of conductor lines and over 570 via-fill conductors connected in series. Any break in the line conductors and/or via-fill connections resulted in infinite resistance. After the first firing, parts were removed, resistance was measured and firing was repeated. At the end of each firing, parts were removed and resistance values were measured. The test parts were mounted on terminal posts and electrically connected to a digital ohm-meter. The temperature was adjusted to 25° C. The total resistance values in milli-ohms was divided by the total number of conductor squares, excluding the area of the via-fill conductors. The results were recorded as milli-ohms per square.

Fired parts were cut using a diamond cutter, polished and microstructures were taken using Scanning Electron Microscope (SEM) in the manner known well to those skilled in the art.

FIG. 2 represents a buried serpentine test of a silver metal system. The buried serpentine test pattern consisted of conductive lines of 6 mil in width with a length that gave approximately 5,000 squares printed on dielectric tape and laminated with at least one layer of dielectric tape. The structure was fired in a typical LTCC firing profile for approximately 3.5 hours, resistance was measured, and refire was performed at a 30 minute thick film profile. Resistance was measured after each firing.

Typical dielectric "green" tapes useful in the present invention include those disclosed in U.S. Pat. No. 6,147,019. Additionally, DuPont Product Nos. 943 Green Tape™ and 944 Green Tape™ (available from E. I. du Pont de Nemours and Company) are further examples of those useful in the present invention.

EXAMPLES

In the Examples that follow, the glass compositions detailed in Table 1 were used. Glasses A, B, C, and D represent glasses that are useful in the present invention.

TABLE 1

GLASS FRIT COMPOSITIONS
Glass Composition (in weight percent total glass frit composition)

|  | A | B | C | D |
|---|---|---|---|---|
| Silicon Dioxide | 30.0 | 55.0 | 33.1 | 56.5 |
| Aluminum Trioxide | 10.1 | 14.0 | 6.7 | 9.1 |
| Boron Oxide | 8.0 | 7.5 | 0.0 | 4.5 |
| Barium Oxide | 26.1 | 0.0 | 23.1 | 0.0 |
| Calcium Oxide | 6.0 | 21.5 | 4.5 | 8.6 |
| Magnesium oxide | 1.7 | 1.0 | 0.0 | 0.0 |
| Strontium Oxide | 0.0 | 0.0 | 13.5 | 0.0 |
| Zirconium Oxide | 0.0 | 0.0 | 3.5 | 0.0 |
| Zinc Oxide | 10.0 | 0.0 | 15.6 | 0.0 |
| Lead oxide | 0.0 | 0.0 | 0.0 | 17.2 |
| Alkali oxides | 0.0 | 0.5 | 0.0 | 4.1 |
| Titanium Oxide/Iron oxide | 8.1 | 0.5 | 0.0 | 0.0 |

CONDUCTOR SYSTEMS: Examples 1-11 represent working examples of the present invention. All formulations are given in weight percent total thick film composition. Non-flake silver powders represented below have an average surface area to weight ratio of 0.1-2.0 m2/g. Palladium metal powders represented below have an average surface area to weight ratio of 2.0-15.0 m2/g. Platinum metal powders represented below have an average surface area to weight ratio of approximately 10 m2/g to 30 m2/g. The average particle size distribution of the gold metal powders is in the range of 1-4 microns.

Example 1

Gold Via Fill Conductor-1

| Gold Powder | 90.0 |
|---|---|
| Frit Powder D | 3.0 |
| Aluminum Oxide | 2.0 |

Ethyl cellulose/texanol-based medium represents the balance
Gold powder PSD d50' 2-3 um

Example 2

Gold Via Fill Conductor-2

| Gold Powder | 89.8 |
|---|---|
| Aluminum Oxide | 2.1 |
| Other Oxides | 3.2 |

Ethyl cellulose/terpineol-based medium represents the balance
Gold powder PSD d50~1-2 um

Example 3

Palladium-silver Transition Via Fill Conductor for Mixed Metal System

| Silver Powder | 86.5 |
|---|---|
| Palladium powder | 3.0 |
| Frit Powder D | 0.8 |

Ethyl cellulose/texanol-based medium represents the balance
Palladium powder SA~1.1-1.7 m2/gm
Silver powder SA~0.1-1.5 m2/gm

Example 4

Palladium-silver-platinum Transition Via Fill Conductor for Mixed Metal System

| Silver Powder | 82.2 |
|---|---|
| Palladium powder | 3.0 |
| Platinum | 5.1 |
| Frit Powder C | 0.8 |

Ethyl cellulose/texanol-based medium represents the balance
Palladium powder SA~1.1-1.7 m2/gm
Platinum Powder SA~0.7-1.2 m2/gm

Example 5

Wire-bondable/Inner/Ground Plane Gold Conductor

| Gold powder | 80.7 |
|---|---|
| Frit powder C | 0.8 |

Ethyl cellulose/terpineol-based medium represents the balance
Gold powder PSD d50~2-3 um

Example 6

Wire-bondable Top Conductor for "Mixed Metal System"

| Gold powder | 78.0 |
|---|---|
| Frit powder C | 0.7 |

Ethyl cellulose/terpineol-based medium represents the balance

Gold powder PSD~d50 4-5 um

Example 7

Gold Inner Conductor

| Gold powder | 80.7 |
|---|---|
| Frit powder D | 0.8 |

Ethyl cellulose/terpineol-based medium represents the balance

Gold powder PSA d50~2-3 um

Example 8

Silver Via Fill Conductor-1

| Silver Powder | 90.9 |
|---|---|
| Frit powder B | 1.2 |

Ethyl cellulose/texanol-based medium represents the balance
Silver powder SA 0.1-1.5 m2/gm Example 9

Silver Via-fill Conductor-2

| Silver powder | 89.5 |
|---|---|
| Frit powder D | 1.2 |

Ethyl cellulose/texanol-based medium represents the balance
Silver powder SA~0.1-1.5 m2/gm Example 10

Silver Ground Plane & Inner Conductor

| Silver powder | 80.6 |
|---|---|
| Frit powder B | 1.2 |
| Organo metallics | 1.0 |

Ethyl cellulose/texanol-based medium represents the balance
Silver powder SA 0.1-1.5 m2/gm Example 11

Silver-palladium Solderable Top Conductor

| Silver powder | 53.5 |
|---|---|
| Palladium powder | 13.6 |
| Copper bismuth ruthenate | 5.1 |
| Copper oxide | 0.5 |

Ethylcellulose/terpineol-based medium represents the balance
Flake Silver SA~0.60-0.90 m2/gm Tap density 4.0-6.0 g/ml FIGS. 1, 3 and 4 represent daisy chain tests of the following conductor systems of the present invention. FIG. 1 utilizes the silver conductor compositions identified in Examples 8 and 10. FIG. 3 utilizes the conductors identified in Examples 1, 5, and 7. FIG. 4 utilizes the conductor systems identified in Examples 4, 6, and 10.

FIG. 2 represents a buried serpentine test of the following conductor systems. The conductor identified in Example 10 was utilized to generate FIG. 2.

All of the FIGS. 1, 2, 3, and 4 detail the resistivity performance of the conductor systems upon initial firing and re-firing conditions. All conductor systems represented show adequate performance with repeated re-firing.

Comparative Example 12

Representation of Prior Art

Standard commercially available LTCC thick film conductors Product Nos. 6142 and 6145 (available from E. I. du Pont de Nemours and Company) were printed over low loss LTCC green tapes and fired at standard LTCC firing profile. Analysis of the parts showed that most of the parts failed to get a resistivity reading. Scanning Electron Micrographs (SEM) of the failed parts were taken and noted partially "dissolved" conductor lines and growth of elongated crystals consisting of dielectric ingredients within the conductor lines. Some parts showed unacceptable levels of high resistivity. On refiring, the resistivity of these parts further increased.

The suggested mechanism is the following. Standard LTCC conductor compositions contain glass binders that are miscible with the remnant glass present in the low-loss LTCC dielectric tape. On firing, dielectric components diffused into the conductor, resulting in increased the resistivity and/or crystals of tape ingredients grew within the conductors which causes the break in the conductor path and/or conductor lines are "sinking" in the low viscosity remnant glass present in the LTCC".

What is claimed is:

1. A lead free thick film composition for use in low temperature co-fired ceramic circuits comprising, based on weight percent total thick film composition:
    (a) 30-98 weight percent finely divided particles selected from noble metals, alloys of noble metals and mixtures thereof
    (b) 0.2-20 weight percent of inorganic binder material containing one or more high-softening refractory glass compositions with a specific viscosity (log n) in the range of 6-7.6 at the firing temperature of said circuit, wherein said refractory glass compositions comprise, based on weight percent total glass composition, 40-60% $SiO_2$, 10-20% $Al_2O_3$, 10-15% $B_2O_3$, 15-25% CaO, and 1-5% balance other network modifying ions; dispersed in
    (c) organic medium; and
        wherein said glass compositions are immiscible with remnant glasses present in the low temperature co-fired ceramic substrate glasses at the firing conditions, and said firing is at 300-600 degrees C. after a 5-20 minute period of firing at 800-950 degrees C.

2. The composition of claim 1 wherein said noble metals are selected from Au, Ag, Pd, and Pt.

3. The composition of claim 1 wherein said alloys of noble metals are alloys of metal selected from Au, Ag, Pd and Pt.

4. The composition of claim 1 wherein said noble metal is Au.

5. The composition of claim 1, wherein the inorganic binder material further comprises 0.1-5 weight percent, based on weight percent total thick film composition, an additional inorganic binder selected from the group consisting of (i) metal oxides, (ii) precursors of metal oxides; (iii) non-oxide borides; (iv) non-oxide silicides; and (v) mixtures thereof.

6. The composition of claim 5 wherein said metal oxides are selected from oxides of Zn, Mg, Co, Al, Zr, Mn, Ni, Cu, Ta, W, La and mixtures thereof.

7. The composition of claim 5 wherein said precursors of metal oxides are precursors of Zn, Mg, Co, Al, Zr, Mn, Ni, Cu, Ta, W, La and mixtures thereof.

* * * * *